US008012886B2

(12) United States Patent  
Kwan et al.

(10) Patent No.: US 8,012,886 B2
(45) Date of Patent: Sep. 6, 2011

(54) LEADFRAME TREATMENT FOR ENHANCING ADHESION OF ENCAPSULANT THERETO

(75) Inventors: Yiu Fai Kwan, Hong Kong (HK); Tat Chi Chan, Hong Kong (HK); Wai Chan, Hong Kong (HK); Chi Chung Lee, Hong Kong (HK)

(73) Assignee: ASM Assembly Materials Ltd, Hong Kong (HK)

( * ) Notice: Subject to any disclaimer, the term of this patent is extended or adjusted under 35 U.S.C. 154(b) by 391 days.

(21) Appl. No.: 11/683,234

(22) Filed: Mar. 7, 2007

(65) Prior Publication Data

US 2008/0216921 A1  Sep. 11, 2008

(51) Int. Cl.
  *H01L 21/31* (2006.01)
(52) U.S. Cl. ........ 438/770; 438/687; 438/761; 438/763; 438/778; 438/782; 438/787; 438/909; 438/974
(58) Field of Classification Search ............... 438/687, 438/761, 763, 770, 778, 782, 787, 909, 930, 438/974, FOR. 390, FOR. 395
  See application file for complete search history.

(56) References Cited

U.S. PATENT DOCUMENTS

| 4,822,550 | A | * | 4/1989 | Komathu | 264/263 |
| 4,946,518 | A | | 8/1990 | Spanjer et al. | 148/282 |
| 5,171,474 | A | * | 12/1992 | Tono | 252/301.4 S |
| 5,459,103 | A | * | 10/1995 | Kelleher et al. | 205/125 |
| 6,391,872 | B1 | * | 5/2002 | Marfat | 514/218 |
| 7,049,683 | B1 | | 5/2006 | Sirinorakul et al. | 257/666 |
| 7,205,180 | B1 | * | 4/2007 | Sirinorakul et al. | 438/123 |
| 2002/0014309 | A1 | * | 2/2002 | Takatoh et al. | 156/345 |
| 2002/0040728 | A1 | * | 4/2002 | Yoshikawa | 136/263 |
| 2003/0100101 | A1 | * | 5/2003 | Huth et al. | 435/264 |
| 2003/0127129 | A1 | * | 7/2003 | Yoshikawa et al. | 136/263 |
| 2004/0102496 | A1 | * | 5/2004 | Duplantier et al. | 514/365 |
| 2005/0175601 | A1 | * | 8/2005 | Rueck et al. | 424/94.5 |
| 2006/0113006 | A1 | * | 6/2006 | Masuda et al. | 148/270 |
| 2006/0234913 | A1 | * | 10/2006 | Arbit et al. | 514/3 |
| 2008/0057555 | A1 | * | 3/2008 | Nguyen | 435/165 |
| 2008/0254013 | A1 | * | 10/2008 | Angst et al. | 424/93.46 |

* cited by examiner

*Primary Examiner* — N Drew Richards
*Assistant Examiner* — Joannie A Garcia
(74) *Attorney, Agent, or Firm* — Ostrolenk Faber LLP

(57) ABSTRACT

A method is provided for treating a leadframe comprising copper or copper alloy to enhance adhesion of molding compound to it. The leadframe is oxidized in an oxidation treatment bath to form copper oxide on the surface of the leadframe. It is then dipped in a complexing or chelating agent to enhance the purity of the copper oxide formed. Thereafter, the leadframe is cleaned with an acid to remove any contaminants remaining on the leadframe.

16 Claims, 3 Drawing Sheets

LEADFRAME TREATMENT FOR ENHANCING ADHESION OF ENCAPSULANT THERETO

FIELD OF THE INVENTION

The invention relates to semiconductor devices and more specifically to the fabrication of leadframes for supporting integrated circuit (IC) chips during semiconductor assembly and packaging.

BACKGROUND AND PRIOR ART

Leadframes are commonly used as carriers for mounting IC chips during the assembly and packaging of semiconductor devices. The base material of the leadframe is typically made from copper or copper alloy. In the assembly process, an IC chip is mounted onto the leadframe used as a support structure, and electrical connections are made between the chip and the leadframe, typically by the welding conductive wires between respective contact pads on the IC chip and the leadframe. These connections allow electrical connectivity between the IC chip and external devices to which the semiconductor device may later be attached. Thereafter, the IC chip and wires are molded with an encapsulant, such as epoxy molding compound ("EMC"), to protect the IC chip and wires from the external environment.

In order to ensure proper functioning of the package, it is essential that the encapsulant adheres adequately to the leadframe. If such adhesion is not strong enough, the encapsulant may delineates from the leadframe, especially when the package encounters thermal stress at high temperatures and trapped water vapor evaporates, resulting in device failure or the so-called "popcorn failure". Previously, with lead-based solder material, solder reflow temperatures to which the packages were exposed were lower, at about 220° C. However, with lead-free solders introduced due to environmental concerns, higher temperatures of up to 260° C. are required during soldering, thereby increasing the thermal stress inside the package and aggravating the risk of package failure.

One approach to enhancing encapsulant adhesion is to make the leadframe surface rough so as to improve the bonding strength between the leadframe surface and the encapsulant.

A prior art method of roughening the leadframe surface is described in U.S. Pat. No. 4,946,518 entitled "Method for Improving the Adhesion of a Plastic Encapsulant to Copper Containing Leadframes". The adhesion of plastic encapsulants to leadframes containing substantial amounts of copper is improved by exposing the leadframes to an active oxygen ambient such as hydrogen peroxide at temperatures below the leadframe annealing temperature. The treatment strengthens any native oxide present on the leadframes, which is found to promote encapsulant adhesion. At the same time, exposed nickel on the leadframe used for bonding wires to the leadframe is cleaned by the active oxygen ambient.

However, whilst the disclosure is especially suitable for leadframes comprising nickel plating to facilitate wire bonding, nowadays the majority of IC packages use leadframes with sliver plating instead of nickel for this purpose. The presence of impurities formed as a result of the oxidizing process may impede the bonding between conductive wires and contact pads on the leadframe. Thus, the process is not satisfactory as it is not catered towards the cleansing of leadframes comprising plating other than nickel plating for the contact pads, such that impurities or contaminants may remain on the contact pads.

Another prior art process is disclosed in U.S. Pat. No. 7,049,683 entitled "Semiconductor Package including Organo-Metallic Coating Formed on Surface of Leadframe Roughened using Chemical Etchant to Prevent Separation Between Leadframe and Molding Compound". In this process, the metal leadframe is specially treated by roughening it with a chemical etchant. In one embodiment, a leadframe made of copper is roughened with a chemical etchant that contains sulfuric acid and hydrogen peroxide. As a result, an organo-metallic coating is formed on the leadframe surface to reduce the possibility of separation between a molding compound and the leadframe as the package undergoes thermal cycles and/or to inhibit the ingress of moisture into the package.

In general, since specific portions of the copper leadframe are electroplated with metals such as silver, nickel or palladium to facilitate wire bonding between the leads of the leadframe and gold or copper wire during the assembly process, the interface between the said metallic plating on the leadframe and the wire material should ideally be free from any contaminant so as to promote good bond strength between the two materials. On the other hand, after the roughening process, the presence of an organo-metallic complex or copper ions left on the plating surface may degrade the bond strength between the leadframe and the bonding wire.

Accordingly, it would be beneficial to be able to remove impurities that are produced on the silver plated surface of the leadframes after conducting the roughening process. It would also be advantageous to develop a process that avoids the coating of organo-metallic material on the surface of the leadframe which may result in the degrading of the bond strength between the leadframe and the bonding wire.

SUMMARY OF THE INVENTION

It is thus an object of the invention to seek to introduce a layer of copper oxide to the leadframe surface to enhance the adhesion of an encapsulant to it, while reducing the amount of impurities on the leadframe surface that might degrade the bond strength between the leadframe and bonding wires to be connected to it.

Accordingly, the invention provides a method for treating a leadframe to enhance adhesion of molding compound to it, comprising the steps of: providing a leadframe comprising copper or copper alloy; oxidizing the leadframe in an oxidation treatment bath to form copper oxide on the surface of the leadframe; dipping the leadframe in a complexing or chelating agent to enhance the purity of the copper oxide formed; and thereafter cleaning the leadframe with an acid to remove contaminants remaining on the leadframe.

It will be convenient to hereinafter describe the invention in greater detail by reference to the accompanying drawings which illustrate one embodiment of the invention. The particularity of the drawings and the related description is not to be understood as superseding the generality of the broad identification of the invention as defined by the claims.

BRIEF DESCRIPTION OF THE DRAWINGS

An example of a leadframe and a treatment process according to the preferred embodiment of the invention will now be described with reference to the accompanying drawings, in which.

DETAILED DESCRIPTION OF THE PREFERRED EMBODIMENT OF THE INVENTION

Figure 1:
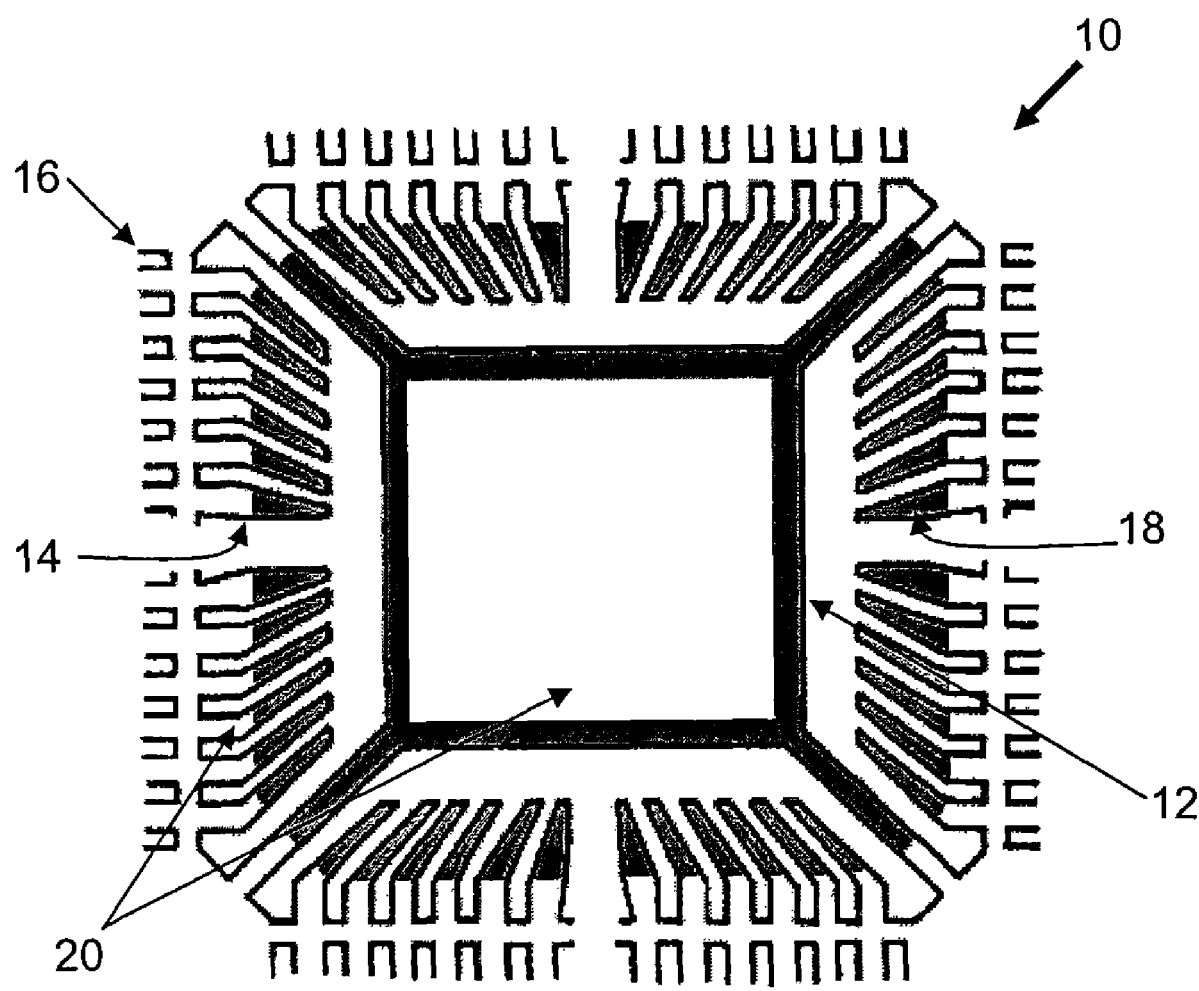
FIG. 1 is a plan view of an exemplary leadframe illustrating areas which are selectively plated with silver.

FIG. 1 is a plan view of an exemplary leadframe 10 illustrating areas which are selectively plated with a silver plating 18, such as areas for connecting bonding wires to the leadframe 10. The layout may vary for different applications. The leadframe 10 is preferably made of a base material comprising copper or copper alloy. It comprises a centrally-located die pad 12 for mounting an IC chip, and the die pad 12 is surrounded by leads generally including inner leads 14 and outer leads 16. Silver plating 18 is primarily plated on the inner leads 14. Bonding wires (not shown) that are connected to the IC chip mounted on the die pad 12 are bonded to the inner leads 14 generally where the silver plating 18 is located.

Other unplated areas 20 that are not used either for wire bonding or soldering need not be plated with silver plating 18, although some plating may also be selectively introduced depending on function. Instead, the base copper material is preferably exposed at the unplated areas 20. These unplated areas 20 should preferably be roughened, such as by oxidation to produce copper oxide, so as to enhance the adhesion of an encapsulant in the form of molding compound to the leadframe 10 after molding.

Figure 2:
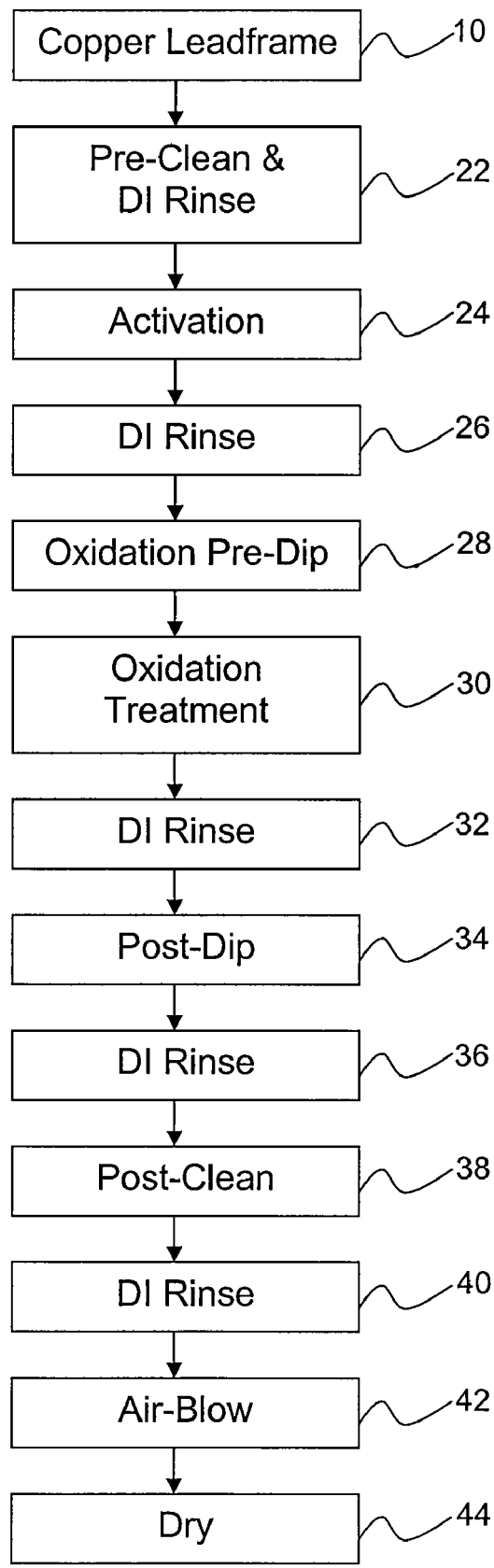
FIG. 2 shows an overview of a process for treating a leadframe according to the preferred embodiment of the invention.

FIG. 2 shows an overview of a process for treating a leadframe 10 according to the preferred embodiment of the invention. The leadframe 10 comprises copper or copper alloy and preferably has been selectively plated with silver plating on some areas of the leadframe 10, for instance in accordance with FIG. 1. The leadframe 10 first goes through pre-cleaning and DI rinsing 22. At this step, the leadframe 10 is treated with a cleaner to remove any dirt, oil and contaminants such as fingerprints. The cleaner may comprise any type of alkaline or solvent cleaner, such as sodium hydroxide with 10-50 gm/L concentration or triethylene amine with 5-10% concentration. It is then rinsed with de-ionized ("DI") water during DI rinsing.

The leadframe 10 then undergoes activation 24 to prepare a clean and free copper metal surface and to neutralize any alkaline film present on it to prepare it for oxidation treatment. The activation bath preferably contains mineral acid to remove any residual alkaline film and/or oxide film. Such mineral acid may comprise hydrochloric acid, phosphoric acid, sulfuric acid, nitric acid or a mixture thereof.

Thereafter, the leadframe 10 is placed into a chemical bath for oxidation pre-dip 28 to prevent the introduction of de-ionized water into the oxidation treatment bath used during later oxidation treatment 30. This step helps to stabilize the oxidation treatment bath. The chemical bath may have the same constituents as the oxidation treatment bath (described below) comprising a topography modifier and an organic additive, except that an oxidation agent is not necessary.

Oxidation treatment 30 of the leadframe 10 is then performed in an oxidation treatment bath in order to form copper oxide on the surface of the leadframe 10. During this treatment, the copper or copper alloy in the base material will be coated with a complex film comprising cuprous oxide ($Cu_2O$), cupric oxide (CuO) and complex copper salts. The oxidation treatment bath preferably comprises a strong oxidizing agent, a topography modifier, and an organic additive to control the oxidation rate.

The oxidizing agent may be hydrogen peroxide, sodium persulfate, sodium chlorite or a mixture thereof. The topography modifier may comprise one of the triazoles, tetrazoles, imidoazoles or a mixture thereof. The organic additive can be an amine or quaternary ammonium salt. The thickness of the oxidized copper or copper oxide is preferably in the range of between 50 Å and 500 Å, most preferably between 80 Å and 160 Å. After oxidation, DI rinsing 32 is performed again.

After oxidation, it is desirable to remove cuprous salt or cupric salt or other contaminants, especially those formed previously as by-products at the oxidation treatment step. This can be done by post-dipping 34 of the oxidized leadframe 10 in a complexing or chelating agent in order to enhance the purity of the copper oxide formed by reducing contaminants.

The complexing or chelating agent may comprise one of a variety of nitrogen, oxygen or sulfur-containing compounds. The complexing agent can be a nitrogen-containing compound such as ammonia, ammonium salt (eg. ammonium chloride), amino acid (eg. ethylenediamine tetra-acetic acid) or a mixture thereof. Alternatively, an oxygen-containing compound containing a carboxylic group (eg. oxalate, acetate), a hydroxyl group (eg. hydroxide, citrate, tartrate, lactate) or a mixture thereof may be used. Otherwise, the complexing agent can be a sulfur-containing compound such as thiosulfate, thiocyanate, mercaptan or mercaptocarboxylic acid (eg. thiolactate).

Optionally, one may additionally apply ultrasonic, spraying, heating, compressed air or other processes when dipping the leadframe 10 in the complexing or chelating agent for facilitating the chemical reactions taking place during post-dipping 34. The concentration of the complexing or chelating agent in the post-dip bath may be 1-10%. After the post-dip 34, the leadframe 10 is flushed with a DI rinse 36.

It is then preferable for the leadframe 10 to undergo post-cleaning 38 to remove the residue of any cuprous or cupric complex, copper salt or other contaminants remaining from the post-dip 34 step. The leadframe 10 is dipped into a chemical bath comprising a mineral acid, sulfuric acid, hydrochloric acid, phosphorous acid, nitric acid or a mixture thereof. The typical concentration of the chemical bath may be 1-10%.

To complete the treatment of the leadframe 10, it may be air-blown 42 by passing it under a blower providing warm, dry air. It is then allowed to dry 44.

Figure 3:
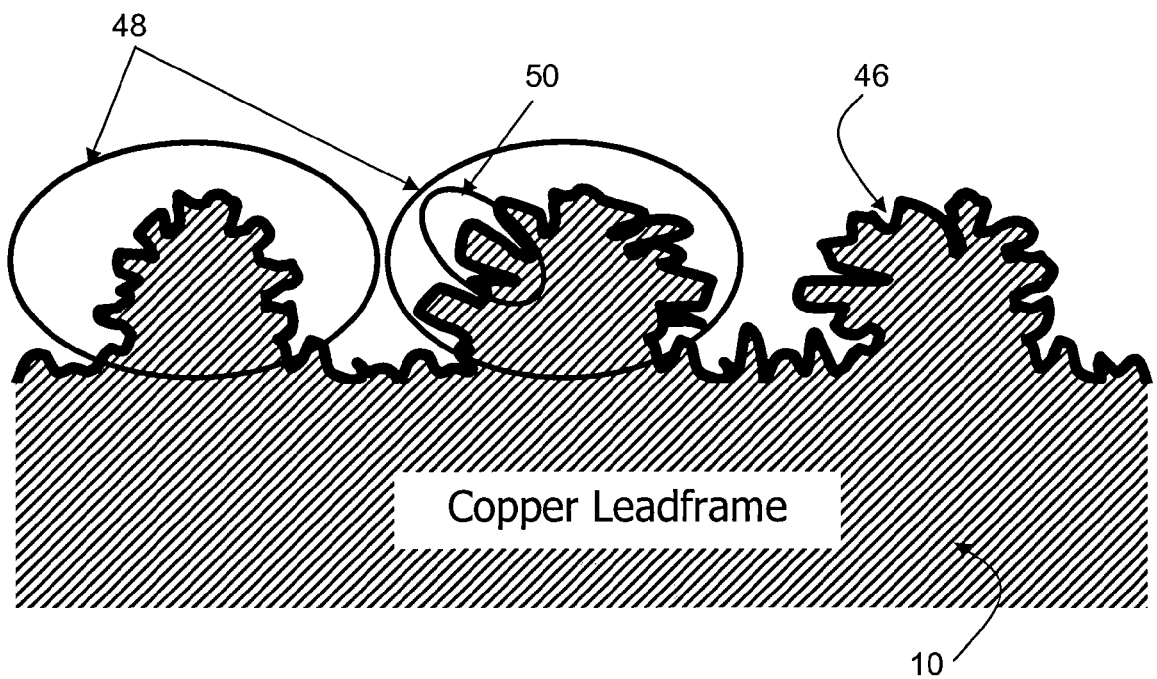
FIG. 3 illustrates a surface morphology of copper oxide formed on a leadframe that has been treated by a process according to the preferred embodiment of the invention.

A surface morphology of copper oxide formed on a leadframe 10 that has been treated according to the preferred embodiment of the invention is illustrated in FIG. 3. The post-clean process as described above not only removes the organic or copper contamination, it also create a unique leadframe surface morphology so as to offer superior adhesion to molding compound.

The treated leadframe 10 has a roughened surface at its unplated areas 20 comprising a layer of copper oxide 46, such as brown oxide, on fibrillar structures formed on the leadframe surface. The fibrillar structures receive and trap molding compound molded onto the surface of the leadframe 10 to enhance adhesion. The morphology comprises irregularities of two orders or levels. The first order or level comprises irregular crystalline formations 48 on a larger scale, to mechanically lock the fillers comprised in the molding compound. The second order or level comprises feather-like formations or dendrites 50 on a smaller scale branching out from the crystalline formations 48, which serve to further increase the contact area between the leadframe and the molding compound and to enhance chemical bonding. These two-order formations provide superior molding compound adhesion performance as compared to the prior art.

An advantage of a leadframe 10 made in accordance with the preferred embodiment of the invention is that the silver plating 18 on the leadframe 10 is free from organic or copper contamination, thus resulting in excellent bondability with bonding wire. Furthermore, the coherent pure copper oxide layer that is formed with a unique fibrillar structure offers superior adhesion of molding compound to the leadframe 10 as compared to the prior art.

The invention described herein is susceptible to variations, modifications and/or additions other than those specifically described and it is to be understood that the invention includes all such variations, modifications and/or additions which fall within the spirit and scope of the above description.

The invention claimed is:

1. A method for treating a leadframe to enhance adhesion of molding compound to the leadframe, the method comprising the steps of:
   providing the leadframe comprising copper or copper alloy and having a surface;
   immersing the leadframe in a pre-dip comprising a topography modifier and an organic additive but without an oxidizing agent to prepare the leadframe before oxidizing the leadframe in an oxidation treatment bath; then
   oxidizing the leadframe in the oxidation treatment bath to form copper oxide on the surface of the leadframe; then
   dipping the leadframe in a complexing or chelating agent to enhance the purity of the copper oxide formed; and thereafter
   cleaning the leadframe with an acid to remove contaminants remaining on the leadframe.

2. The method for treating a leadframe as claimed in claim 1, wherein the oxidation bath comprises an oxidizing agent, a topography modifier and an organic additive.

3. The method for treating a leadframe as claimed in claim 2, wherein the oxidizing agent comprises one or more compounds selected from the group consisting of: hydrogen peroxide, sodium persulfate and sodium chlorite.

4. The method for treating a leadframe as claimed in claim 2, wherein the topography modifier comprises one or more compounds selected from the group consisting of: a triazole, a tetrazole and an imidoazole.

5. The method for treating a leadframe as claimed in claim 2, wherein the organic additive comprises an amine or quaternary ammonium salt.

6. The method for treating a leadframe as claimed in claim 1, wherein the thickness of the copper oxide formed is in the range of 50 Å to 500 Å.

7. The method for treating a leadframe as claimed in claim 1, wherein the complexing or chelating agent comprises at least one compound selected from a group consisting of a nitrogen-containing compound, an oxygen-containing compound and a sulfur-containing compound.

8. The method for treating a leadframe as claimed in claim 7, wherein the complexing or chelating agent comprises one or more compounds selected from the group consisting of: ammonia, amino acid and an ammonium salt.

9. The method for treating a leadframe as claimed in claim 7, wherein the complexing or chelating agent comprises one or more compounds having a carboxylic group or a hydroxyl group.

10. The method for treating a leadframe as claimed in claim 7, wherein the complexing or chelating agent comprises one or more compounds selected from the group consisting of: thiosulfate, thiocyanate, mercaptan and mercaptocarboxylic acid.

11. The method for treating a leadframe as claimed in claim 1, further comprising the step of applying ultrasonic, spraying, heating or compressed air when dipping the leadframe in the complexing or chelating agent.

12. The method for treating a leadframe as claimed in claim 1, wherein the concentration of the complexing or chelating agent in a dipping bath is 1-10%.

13. The method for treating a leadframe as claimed in claim 1, wherein the acid used for cleaning the leadframe comprises one or more acids selected from the group consisting of: a mineral acid, sulfuric acid, hydrochloric acid, phosphoric acid and nitric acid.

14. The method for treating a leadframe as claimed in claim 13, wherein the concentration of acid in a chemical bath used for cleaning the leadframe is 1-10%.

15. The method for treating a leadframe as claimed in claim 1, wherein the copper oxide formed on the leadframe after treatment comprises a layer of copper oxide on fibrillar structures formed on the surface of the leadframe, the fibrillar structures having irregular crystalline formations and dendrites branching out from the said crystalline formations.

16. The method for treating a leadframe as claimed in claim 1, wherein the leadframe that is provided prior to the oxidizing has been selectively plated with silver plating over some areas of the leadframe.

\* \* \* \* \*